United States Patent
Kim et al.

(10) Patent No.: US 11,247,296 B2
(45) Date of Patent: Feb. 15, 2022

(54) STAGE FOR CUTTING SUBSTRATE THAT INCLUDES MAIN STAGE AND DUMMY STAGE, SUBSTRATE-CUTTING DEVICE, AND METHOD OF OPERATING SUBSTRATE-CUTTING DEVICE

(71) Applicant: SAMSUNG DISPLAY CO., LTD., Yongin-si (KR)

(72) Inventors: Eunju Kim, Hwaseong-si (KR); Seoin Han, Cheonan-si (KR)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 385 days.

(21) Appl. No.: 16/273,551

(22) Filed: Feb. 12, 2019

(65) Prior Publication Data
US 2019/0247955 A1    Aug. 15, 2019

(30) Foreign Application Priority Data

Feb. 13, 2018    (KR) .......................... 10-2018-0017964

(51) Int. Cl.
| | |
|---|---|
| *B23K 26/142* | (2014.01) |
| *H01L 21/67* | (2006.01) |
| *H01L 27/32* | (2006.01) |
| *H01L 21/78* | (2006.01) |
| *H01L 51/56* | (2006.01) |
| *H01L 21/00* | (2006.01) |

(Continued)

(52) U.S. Cl.
CPC .......... *B23K 26/142* (2015.10); *H01L 21/00* (2013.01); *H01L 21/67115* (2013.01); *H01L 21/78* (2013.01); *H01L 27/3244* (2013.01); *H01L 51/56* (2013.01); *B23K 2101/42* (2018.08); *B23K 2103/56* (2018.08)

(58) Field of Classification Search
CPC .............. B23K 26/142; B23K 2103/56; B23K 2101/42; B23K 26/0622; B23K 26/082; B23K 26/0876; B23K 37/0408; B23K 26/402; B23K 26/38; B23K 2101/40; H01L 21/00; H01L 21/67115; H01L 27/3244; H01L 21/78; H01L 51/56
See application file for complete search history.

(56) References Cited

U.S. PATENT DOCUMENTS

| | | | | |
|---|---|---|---|---|
| 2010/0039680 | A1* | 2/2010 | Yoon .................... | B23K 26/042 358/474 |
| 2012/0241488 | A1* | 9/2012 | Kang .................... | C03B 33/033 225/2 |

(Continued)

FOREIGN PATENT DOCUMENTS

| | | |
|---|---|---|
| KR | 1020040036376 | 4/2004 |
| KR | 100835622 | 5/2008 |

(Continued)

*Primary Examiner* — John P. Dulka
(74) *Attorney, Agent, or Firm* — F. Chau & Associates, LLC

(57) ABSTRACT

A substrate-cutting stage includes a main stage and a dummy stage spaced apart from each other with a cutting region interposed therebetween and that support a substrate. The main stage supports a first portion of the substrate, the dummy stage supports a second portion of the substrate, and the cutting region overlaps a to-be-cut portion of the substrate disposed between the first and second portions.

9 Claims, 10 Drawing Sheets

(51) Int. Cl.
*B23K 103/00* (2006.01)
*B23K 101/42* (2006.01)

(56) References Cited

U.S. PATENT DOCUMENTS

2017/0050876 A1* 2/2017 Lee .................. G02F 1/133351
2017/0120379 A1* 5/2017 Choi ..................... B23K 26/38

FOREIGN PATENT DOCUMENTS

KR   1020130142791   12/2013
KR   1020170051598    5/2017

* cited by examiner

STAGE FOR CUTTING SUBSTRATE THAT INCLUDES MAIN STAGE AND DUMMY STAGE, SUBSTRATE-CUTTING DEVICE, AND METHOD OF OPERATING SUBSTRATE-CUTTING DEVICE

CROSS-REFERENCE TO RELATED APPLICATIONS

This U.S. non-provisional patent application claims priority under 35 U.S.C. § 119 from, and the benefit of, Korean Patent Application No. 10-2018-0017964, filed on Feb. 13, 2018 in the Korean Intellectual Property Office, the contents of which are herein incorporated by reference in their entirety.

BACKGROUND

Embodiments of the present disclosure are directed to a cutting device, and in particular, to a substrate-cutting stage, a substrate-cutting device, and a method of operating a substrate-cutting device.

There are various types of flat panel display devices, such as an organic light emitting display (OLED) panel, a liquid crystal display (LCD) panel, an electrophoretic display (ED) panel, a surface-conduction electron-emitter display (SED) panel, a vacuum fluorescent display (VFD) panel, etc.

A display device can be used for mobile devices, such as smart phones, tablet personal computers, laptop computers, digital cameras, camcorders, or mobile information terminals, or electronic products, such as slim televisions, exhibition display devices, or billboards.

Recently, research has been conducted to manufacture a thin display device. In addition, due to its portability and usability with various devices, flexible display devices have attracted attention as next-generation display devices. A flexible display device based on an organic light emitting display technology is one of the most promising display devices.

A process of fabricating a display device includes a cutting process. In a cutting process, contamination materials can be produced from a substrate.

SUMMARY

An embodiment of the inventive concept provides a substrate-cutting stage and a substrate-cutting device that can effectively remove foreign substances deposited on a substrate-cutting stage in a substrate cutting process, and a method of operating the substrate-cutting device.

According to an embodiment of the inventive concept, a substrate-cutting stage includes a main stage and a dummy stage spaced apart from each other with a cutting region interposed therebetween and that support a substrate. The main stage supports a first portion of the substrate, the dummy stage supports a second portion of the substrate, and the cutting region overlaps a to-be-cut portion of the substrate disposed between the first and second portions.

In an embodiment, the dummy stage may enclose the main stage.

In an embodiment, the to-be-cut portion may enclose the first portion.

In an embodiment, the dummy stage may be movable in a thickness direction of the substrate.

In an embodiment, the dummy stage may be rotatable to be inclined at an angle relative to a plane of the main stage.

In an embodiment, the dummy stage may expose one side surface of the main stage and cover other side surfaces of the main stage.

In an embodiment, the dummy stage may include a first dummy portion and a second dummy portion that face each other in a first direction, and a third dummy portion that connects an end of the first dummy portion to an end of the second dummy portion.

In an embodiment, the dummy stage may include a first dummy portion that overlaps with a first corner region of the substrate adjacent to a first side surface of the substrate that extends in a first direction and a third side surface of the substrate that extends in a second direction crossing the first direction, and a second dummy portion that overlaps a second corner region of the substrate adjacent to the third side surface and second side surface of the substrate that faces and is parallel to the first side surface.

In an embodiment, the cutting region may include a first cutting region provided between the first dummy portion and the main stage and a second cutting region provided between the second dummy portion and the main stage.

In an embodiment, the first cutting region may include a first cutting line parallel to the first direction and a second cutting line parallel to the second direction, and the second cutting region may include a third cutting line parallel to the first direction and a fourth cutting line parallel to the second direction.

According to an embodiment of the inventive concept, a substrate-cutting device includes a substrate-cutting stage that loads a substrate, and a laser module that irradiates a laser beam onto a to-be-cut region in the substrate. The substrate-cutting stage may include a main stage on which a first portion of the substrate is disposed, and a dummy stage on which a second portion of the substrate is disposed. The main and dummy stages may be spaced apart from each other with a cutting region interposed therebetween. The cutting region overlaps the to-be-cut region of the substrate.

In an embodiment, the dummy stage may be rotatable to be inclined at an angle relative to a plane of the main stage.

In an embodiment, the dummy stage may include a first dummy portion and a second dummy portion that face each other in a first direction, and a third dummy portion that connects the first dummy portion to the second dummy portion. The first to third dummy portions partially enclose the main stage.

According to an embodiment of the inventive concept, a method of operating a substrate-cutting device includes placing a substrate on a substrate-cutting stage that includes a dummy stage and a main stage, irradiating a laser beam onto the substrate along a to-be-cut region in the substrate, moving the dummy stage to a different height from the main stage in a thickness direction of the substrate, and rotating the dummy stage to be inclined at an angle relative to a plane of the main stage. The dummy stage and the main stage may be spaced apart from each other with a cutting region interposed therebetween. The cutting region overlaps the to-be-cut region of the substrate.

In an embodiment, irradiating the laser beam may divide the substrate into a first portion on the main stage and a second portion on the dummy stage.

In an embodiment, the method may further include removing the second portion using a bar, after rotating the dummy stage.

In an embodiment, the to-be-cut region may be between the first portion and the second portion and may enclose the first portion.

In an embodiment, moving the dummy stage may separate the main stage and the dummy stage from each other in the thickness direction.

In an embodiment, the dummy stage may include a first dummy portion and a second dummy portion that are spaced apart from each other with the main stage interposed therebetween.

In an embodiment, the cutting region may include a first cutting region between the first dummy portion and the main stage, and a second cutting region between the second dummy portion and the main stage. The laser beam may be irradiated to each of the first cutting region and the second cutting region.

Figure 1:
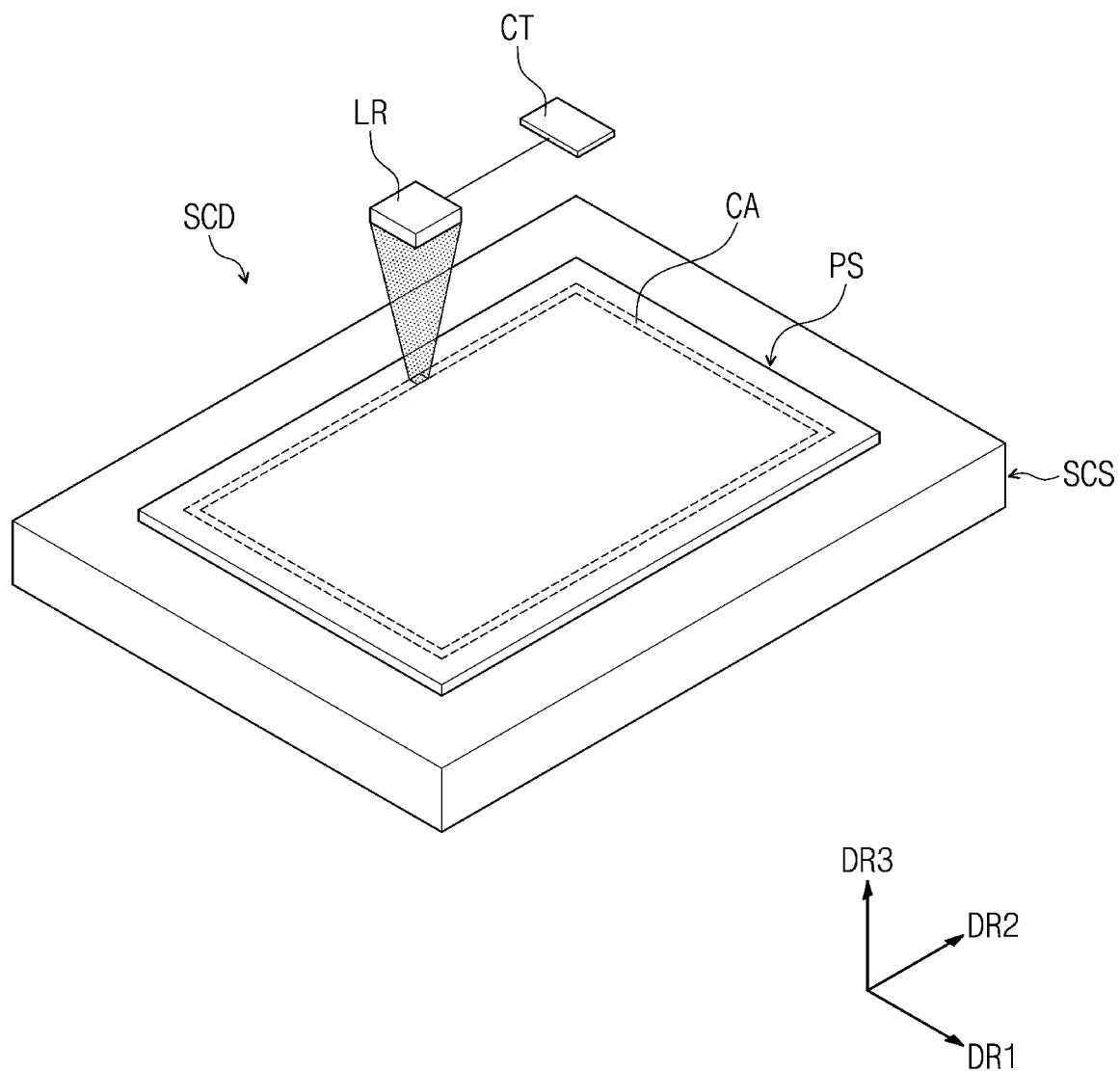
FIG. 1 is a perspective view of a substrate-cutting device according to an embodiment of the inventive concept.

It should be noted that these drawings are not, however, to scale and may not precisely reflect the precise structural or performance characteristics of any given embodiment, and should not be interpreted as defining or limiting the range of values or properties encompassed by exemplary embodiments. The use of similar or identical reference numbers in the various drawings may indicate the presence of a similar or identical element or feature.

DETAILED DESCRIPTION

Exemplary embodiments of the inventive concept will now be described more fully with reference to the accompanying drawings, in which exemplary embodiments are shown. Exemplary embodiments of the inventive concept may, however, be embodied in many different forms and should not be construed as being limited to the embodiments set forth herein. In the drawings, the thicknesses of layers and regions may be exaggerated for clarity. Like reference numerals in the drawings may denote like elements, and thus their description will be omitted.

It will be understood that when an element is referred to as being "connected" or "coupled" to another element, it can be directly connected or coupled to the other element or intervening elements may be present.

Figure 2:
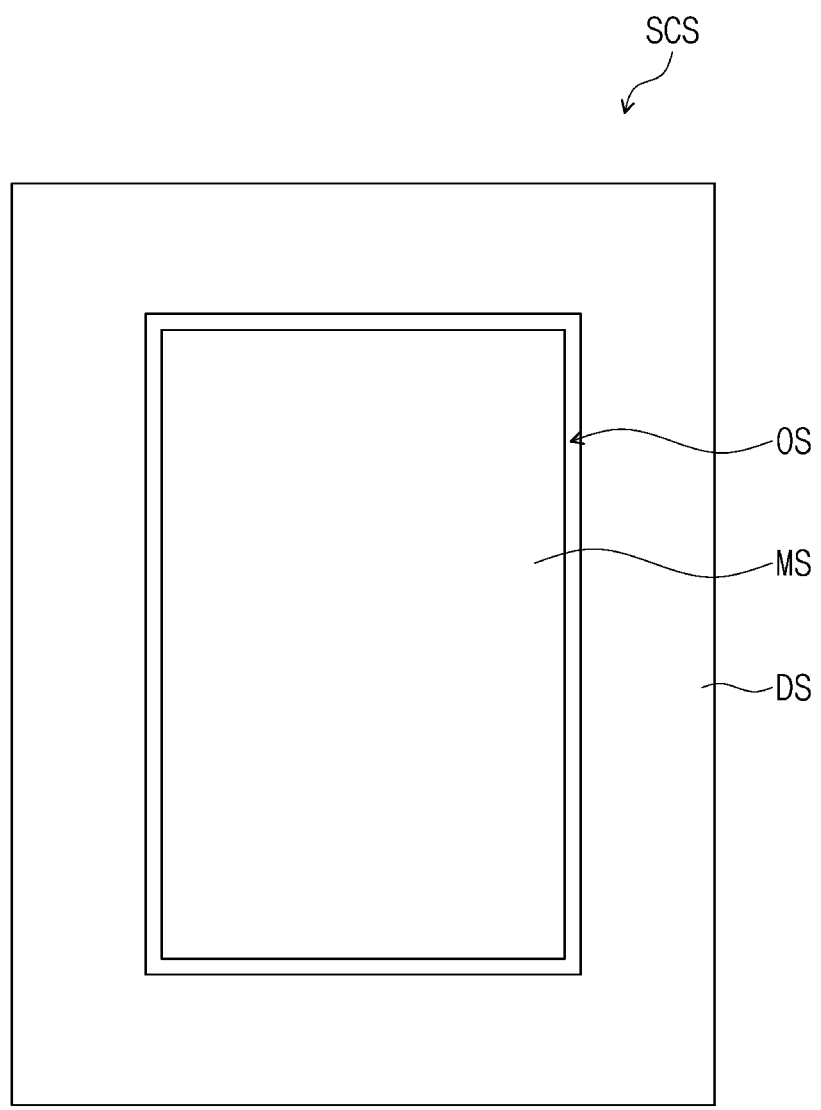
FIG. 2 is a plan view of a substrate-cutting stage according to an embodiment of the inventive concept.

FIG. 1 is a perspective view of a substrate-cutting device according to an embodiment of the inventive concept. FIG. 2 is a plan view of a substrate-cutting stage according to an embodiment of the inventive concept.

Referring to FIG. 1, according to an embodiment, a substrate-cutting device SCD includes a substrate-cutting stage SCS, a laser module LR, and a control unit CT.

According to an embodiment, a substrate PS is placed on the substrate-cutting stage SCS. The substrate PS shown in FIG. 1 represents a substrate to which a process of cutting a cutting region CA using the substrate-cutting device SCD has not yet been performed.

According to an embodiment, the substrate PS is parallel to a plane defined by a first direction DR1 and a second direction DR2. A direction normal to the substrate PS is a third direction DR3. For example, the third direction DR3 is parallel to a thickness direction of the substrate PS. A front or top surface and a rear or bottom surface of a substrate can be distinguished from each other based on the third direction DR3.

According to an embodiment, the substrate PS includes a first portion and a second portion that are spaced apart from each other with the cutting region CA interposed therebetween, and a to-be-cut portion that corresponds to the cutting region CA. In an embodiment, as will be described below, the first portion is a part of a display device, whereas the second portion is a residual portion that remains after the cutting process.

In an embodiment, the substrate PS represents a display module. The display module includes at least one of a display panel that displays an image or an input sensing unit that senses an external input. In an embodiment, the substrate PS is a single base substrate that is provided in the display module.

According to an embodiment, the laser module LR includes a beam generator that emits a laser beam, and an optical system placed in a propagation path of the laser beam. The beam generator may be a solid-state laser, such as a ruby laser, a glass laser, a yttrium aluminum garnet (YAG) laser, or a yttrium lithium fluoride (YLF) laser), a gas laser, such as an excimer laser or a helium-neon (He—Ne) laser, or a pulsed laser.

According to an embodiment, the optical system is located in a propagation path of the laser beam emitted by the beam generator. The optical system includes a homogenizer that homogenizes a beam shape of the laser beam, or a condensing lens that adjusts a focal length of the laser beam. Furthermore, the optical system includes at least one mirror in the propagation path of the laser beam that is used to change a propagation angle of the laser beam. The mirror may include a galvano mirror that linearly changes the propagation angle of the laser beam when an input voltage is changed, or a reflection mirror.

According to an embodiment, the control unit CT controls a position of the laser module LR or an intensity and size of a laser beam emitted from the laser module LR. The control unit CT changes a position of the laser module LR to allow a laser beam to be irradiated onto the substrate PS along the cutting region CA of the substrate PS. The laser module LR is movable in the first direction DR1 and the second direction DR2.

In addition, according to an embodiment, under control of the control unit CT, an intensity of the laser beam can be adjusted so that the substrate PS can be cut. The control unit CT controls a size and an intensity of the laser beam emitted from the beam generator, based on an intensity or size value received from an operator.

Referring to FIG. 2, according to an embodiment, the substrate-cutting stage SCS includes a main stage MS and a dummy stage DS.

In an embodiment, the dummy stage DS defines an opening OS. When viewed in a plan view, the opening OS has a rectangular or tetragonal shape, and the dummy stage DS encloses the opening OS. The main stage MS is disposed in the opening OS and enclosed by the dummy stage DS.

According to an embodiment, the main stage MS has a rectangular or tetragonal shape. The main stage MS has side surfaces that face respective inner side surfaces of the dummy stage DS. Although the main stage MS shown as having a rectangular or tetragonal shape, embodiments of the inventive concept are not limited thereto. For example, the shape of the main stage MS may be variously changed based on the shape of the display module.

According to an embodiment, the opening OS is a gap between the main stage MS and the dummy stage DS and overlaps the cutting region CA.

In an embodiment, the substrate PS is provided on the main stage MS and a portion of the dummy stage DS. For example, at least 60% of the area of the substrate PS is provided on the main stage MS.

According to an embodiment, the first portion of the substrate PS is provided on the main stage MS, and the second portion is provided on the dummy stage DS. A to-be-cut portion that connects the first and second portions overlaps a region, such as the opening OS, between the main stage MS and the dummy stage DS.

According to an embodiment, when the laser beam emitted from the laser module LR is incident into the cutting region CA of the substrate PS, a foreign substance may be produced from the to-be-cut portion that overlaps the cutting region CA. For example, the foreign substance may be or include fume or particles, which can be formed when the to-be-cut portion is cut by the laser beam.

According to an embodiment, such foreign substances can be deposited on a region between the main stage MS and the dummy stage DS. An absorption member may be disposed below the region between the main stage MS and the dummy stage DS to absorb the foreign substance.

However, according to an embodiment, when the foreign substance produced from the to-be-cut portion is deposited on a top surface of the dummy stage DS, a process that removes the foreign substances from the top surface of the dummy stage DS is performed before a process that cuts the substrate.

In an embodiment, the main stage MS and the dummy stage DS are spaced apart from each other, when viewed in a plan view. The main stage MS is not in contact with the dummy stage DS, and, when measured in the third direction DR3, the main stage MS is at a different level from the dummy stage DS.

In particular, according to an embodiment, the dummy stage DS can be rotated to be inclined at an angle, and this rotation of the dummy stage DS can remove the foreign substance on the top surface of the dummy stage DS. For example, the dummy stage DS can be rotated so that its top surface is inclined at an angle. As a result of rotating the dummy stage DS, the foreign substance on the dummy stage DS moves down along the inclined top surface of the dummy stage DS.

Figure 3:
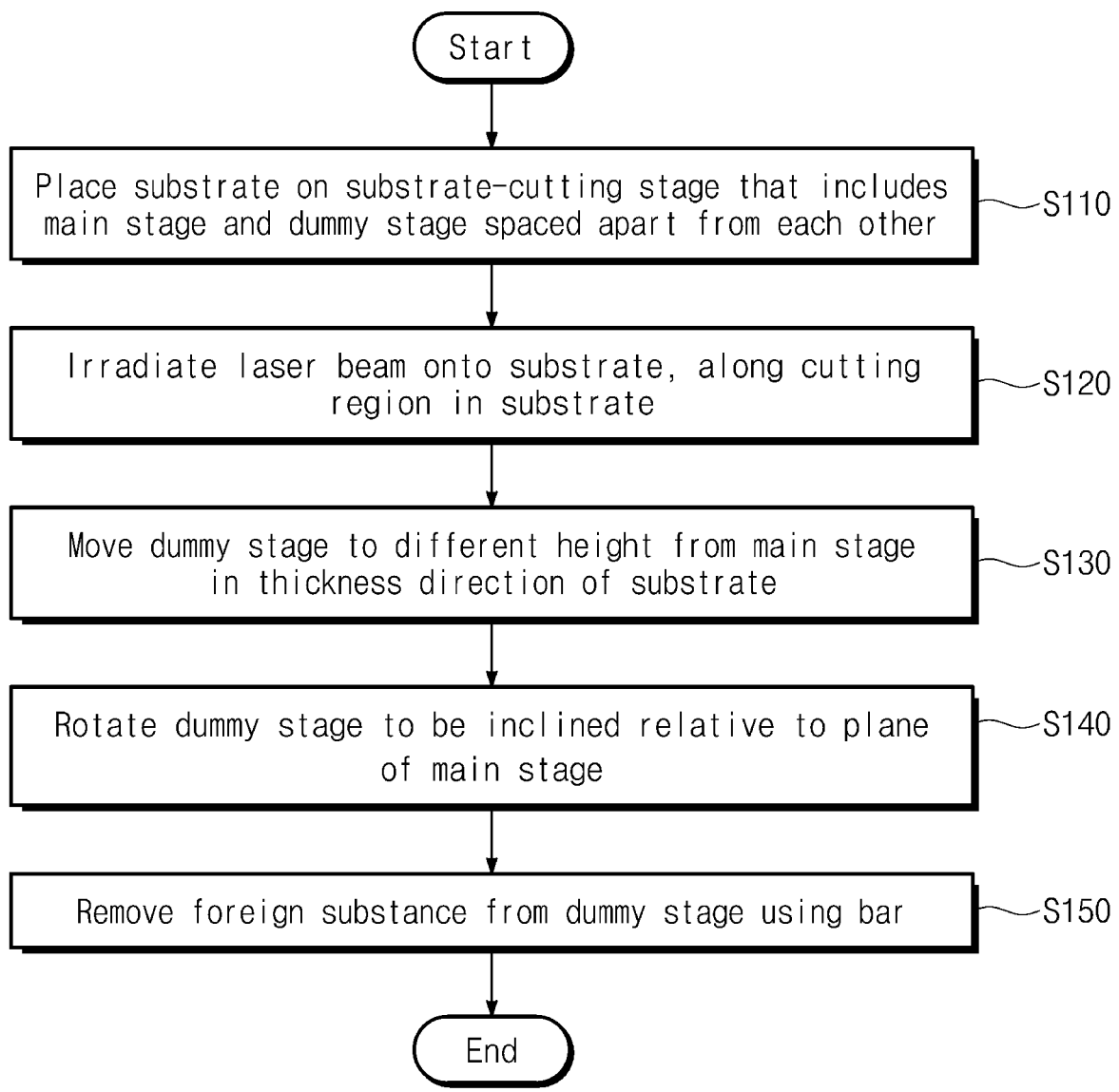
FIG. 3 is a flow chart of a method of operating a substrate-cutting device according to an embodiment of the inventive concept.
Figure 4:
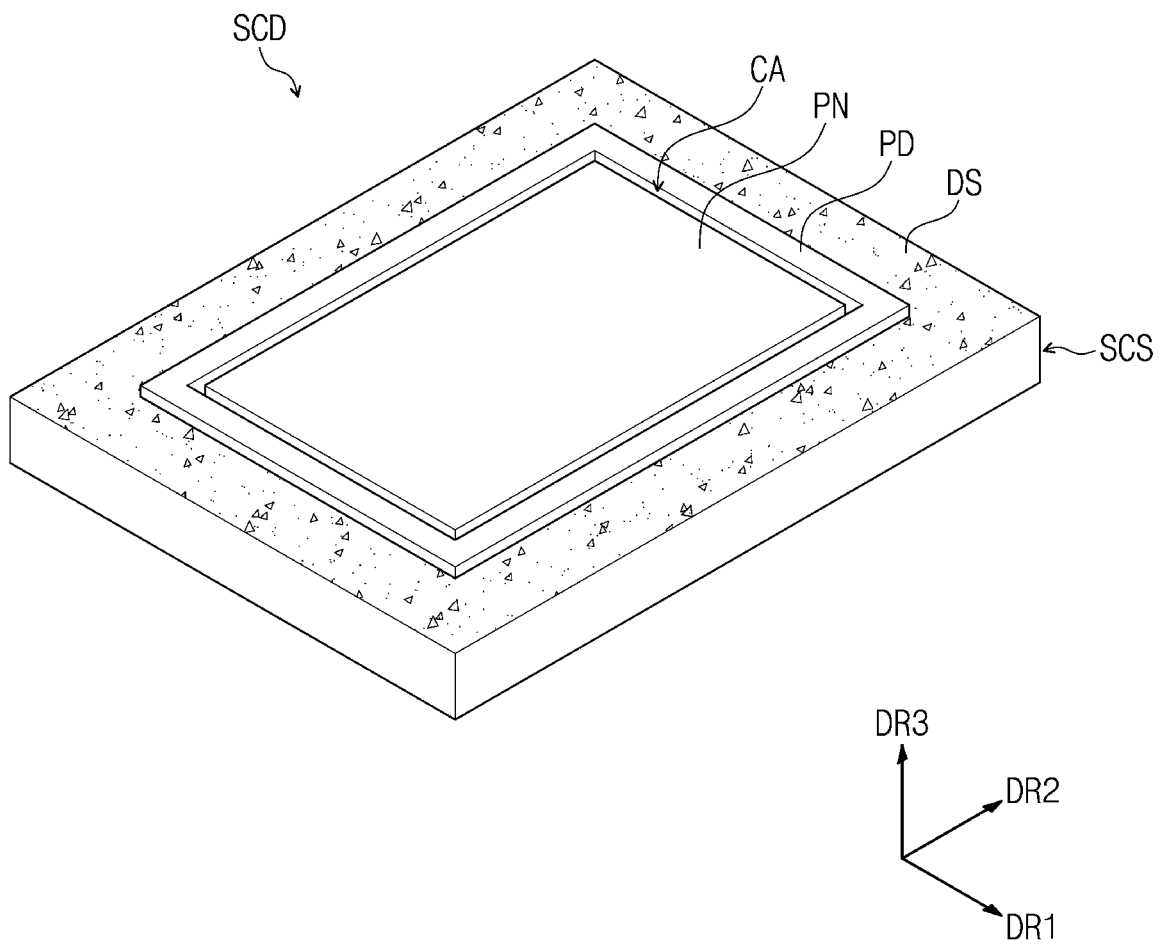
FIG. 4 is a perspective view of a substrate-cutting stage according to an embodiment of the inventive concept.
Figure 5:
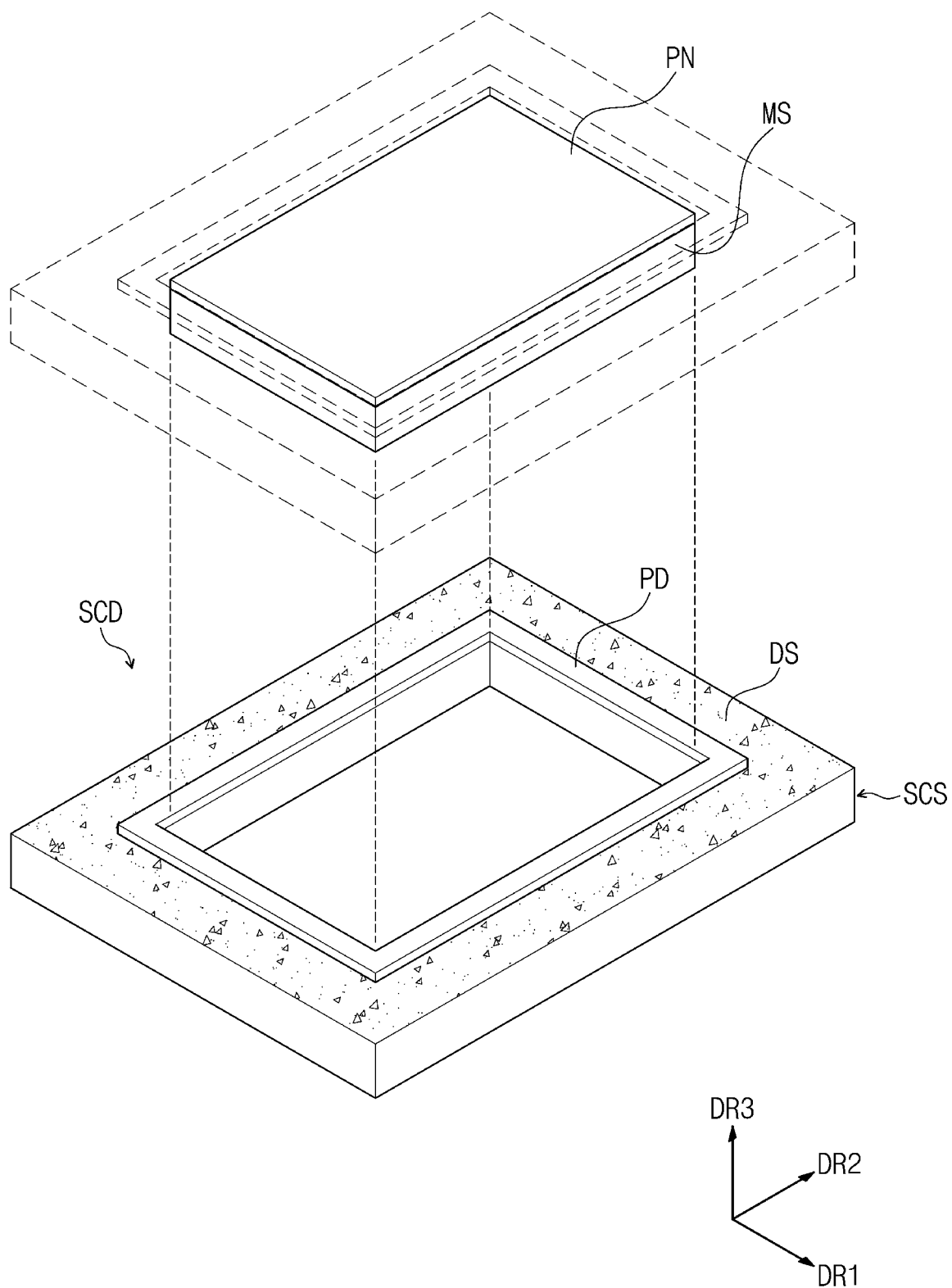
FIG. 5 is an exploded perspective view of a substrate-cutting stage shown in FIG. 4.
Figure 6:
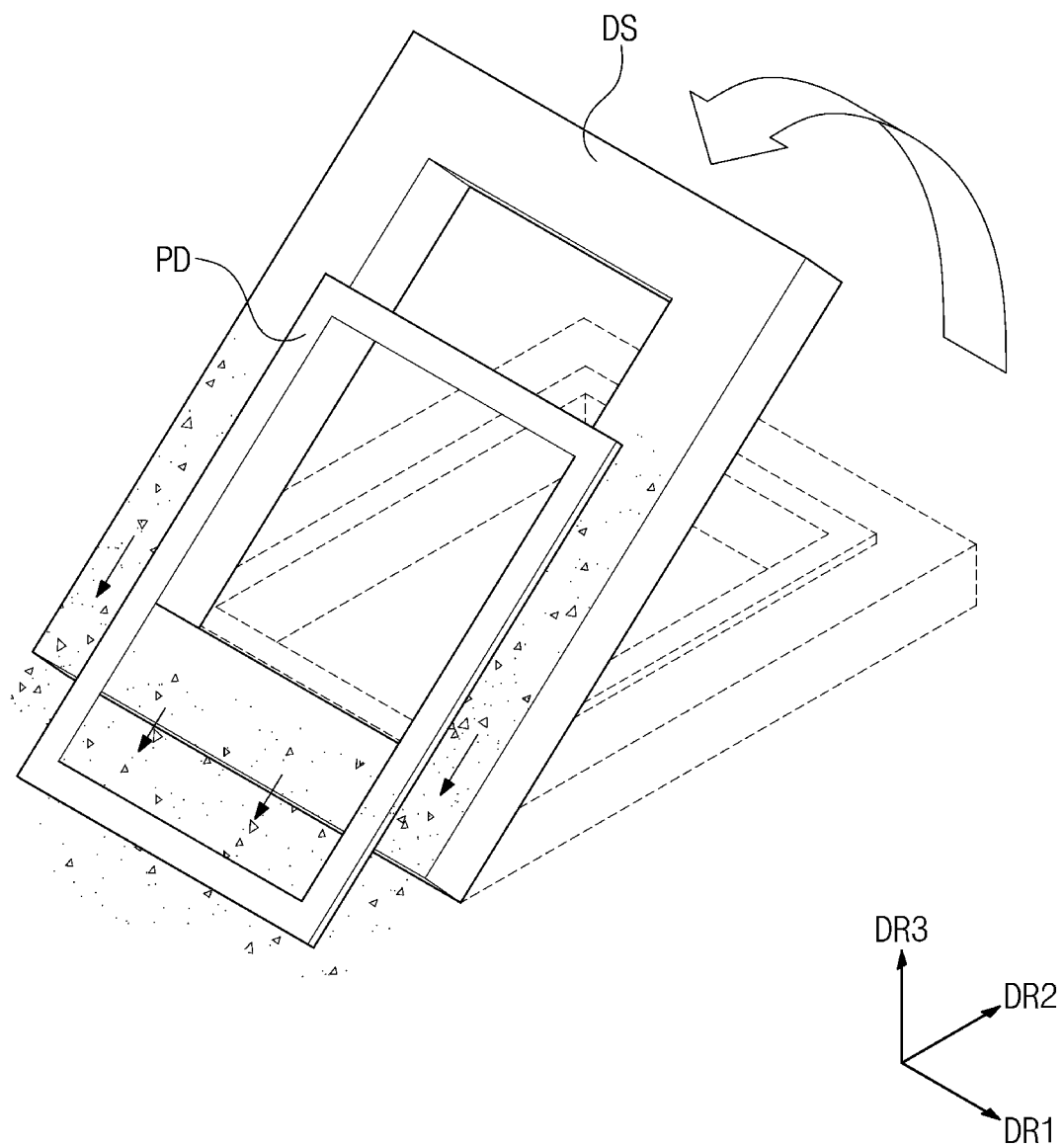
FIG. 6 is a perspective view of a dummy stage shown in FIG. 5.

FIG. 3 is a flow chart of a method of operating a substrate-cutting device according to an embodiment of the inventive concept. FIG. 4 is a perspective view of a substrate-cutting stage according to an embodiment of the inventive concept. FIG. 5 is an exploded perspective view of a substrate-cutting stage shown in FIG. 4. FIG. 6 is a perspective view of a dummy stage shown in FIG. 5.

Hereinafter, a method according to an embodiment of operating a substrate-cutting device and removing a foreign substance deposited on the top surface of a dummy stage DS will be described with reference to FIGS. 3 to 6.

Referring to FIGS. 2 and 3, according to an embodiment, in a first step S110, the substrate PS, in which the cutting region CA is defined, is placed on the substrate-cutting stage SCS. The substrate PS is placed on the main stage MS and the dummy stage DS. The to-be-cut portion and the second portion of the substrate PS, shown in FIG. 2, will be removed.

In a second step S120, according to an embodiment, a laser beam emitted from the laser module LR is irradiated onto the cutting region CA of the substrate PS. As a result, as shown in FIG. 4, the substrate PS is divided into a first portion PN and a second portion PD, which are disposed on the main stage MS and the dummy stage DS, respectively. The to-be-cut portion of the substrate PS that corresponds to the cutting region CA falls onto a region between the main stage MS and the dummy stage DS, and in certain cases, foreign substances by the irradiation of the laser beam are deposited on the dummy stage DS.

In a third step S130, according to an embodiment, the dummy stage DS is moved in the third direction DR3 to a different height from the main stage MS. For example, as shown in FIG. 5, the dummy stage DS is moved downward in the third direction DR3. The description that follows will refer to an example in which the dummy stage DS is moved downward in the third direction DR3, but in other embodiments, the dummy stage DS is moved upward in the third direction DR3.

According to an embodiment, when the dummy stage DS is moved in the third direction DR3, the dummy stage DS does not overlap the main stage MS, when viewed from a direction normal to the first or second direction DR1 or DR2 or parallel to the third direction DR3.

According to an embodiment, the dummy stage DS is supported by a moving device. The dummy stage DS is combined with the moving device when the dummy stage DS is moved upward or downward in the third direction DR3.

In a fourth step S140, according to an embodiment, as shown in FIG. 6, the dummy stage DS is rotated so that its top surface is inclined at an acute angle with respect to the plane defined by the first and second directions DR1 and DR2.

As described above, according to an embodiment, the dummy stage DS is rotated so that its top surface is inclined at an angle. As a result of rotating the dummy stage DS, even when foreign substances are produced from the second portion and the to-be-cut portion of the substrate PS, the foreign substance can be removed along the inclined top surface of the dummy stage DS.

In a fifth step S150, according to an embodiment, a bar BR is used to remove foreign substances on the dummy stage DS. In this case, the bar BR is provided on the top surface of the dummy stage DS and is movable along the inclined surface of the dummy stage DS. In an embodiment, the fifth step S150 may be omitted.

According to an embodiment, when the dummy and main stages are a single non-separable object, an external apparatus is used to move the substrate-cutting stage to remove foreign substances produced by the cutting process. In this case, the manufacturing process may have low productivity.

However, according to an embodiment of the inventive concept, as described above, the dummy stage DS is movable in the third direction DR3, and thus can have a height that differs from that of the main stage MS. Furthermore, the dummy stage DS is rotatable, and in this case, foreign substances deposited on the top surface of the dummy stage DS by the cutting of the substrate PS, and the second portion PD of the substrate PS can slide down the inclined top surface of the dummy stage DS. As a result, foreign substances or the second portion PD of the substrate PS can be effectively removed from the dummy stage DS.

Figure 7:
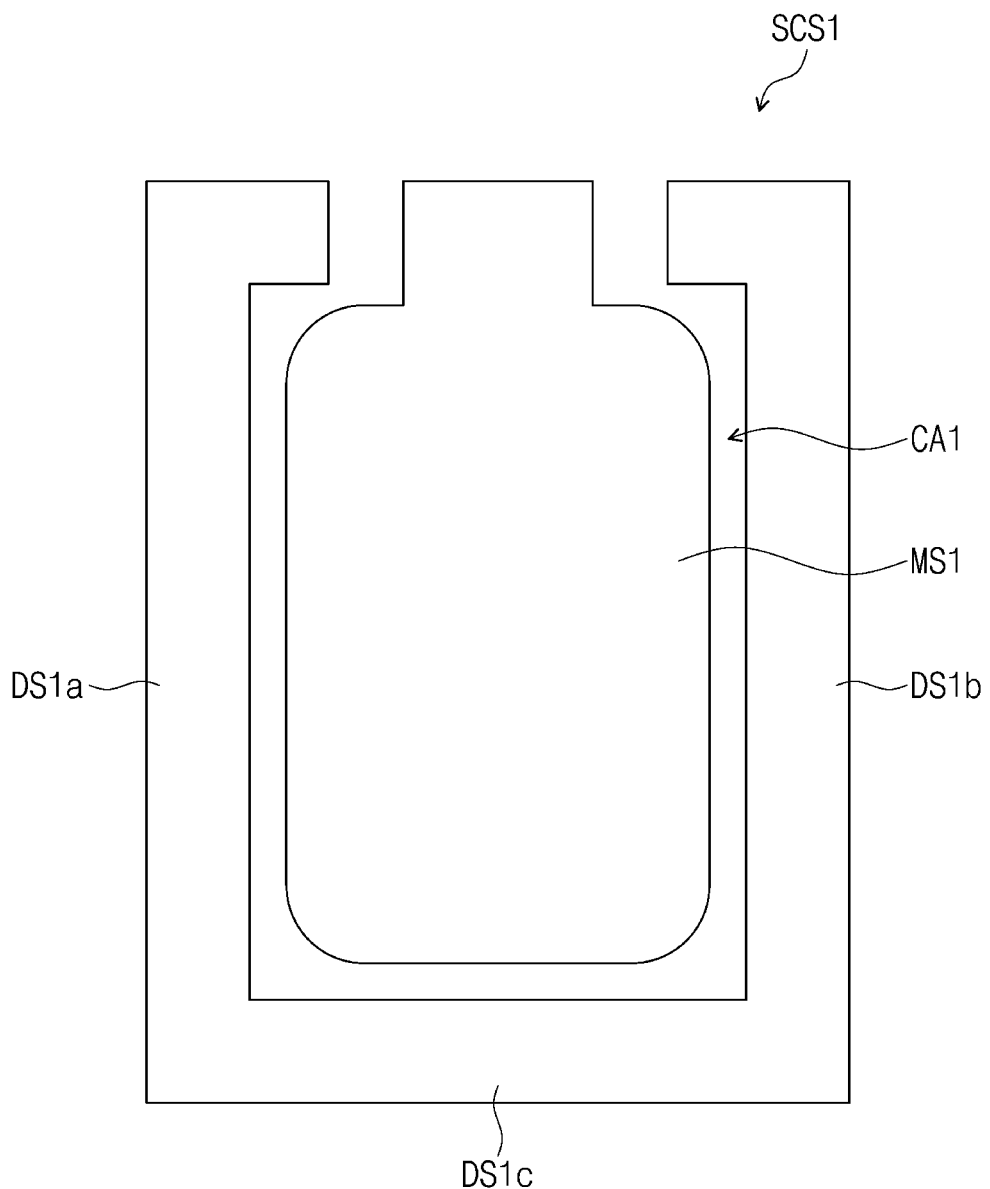
FIG. 7 is a plan view of a substrate-cutting stage according to an embodiment of the inventive concept.

FIG. 7 is a plan view of a substrate-cutting stage according to an embodiment of the inventive concept.

Referring to FIG. 7, according to an embodiment, a substrate-cutting stage SCS1 includes a main stage MS1 and a dummy stage. The substrate-cutting stage SCS1 of FIG. 7 differs from the substrate-cutting stage SCS of FIG. 2 in the shapes of the main and dummy stages, but can be operated in substantially the same manner as a substrate-cutting device previously described with reference to FIG. 3.

In an embodiment, the dummy stage is spaced apart from the main stage MS1 with the cutting region CA1 interposed therebetween, when viewed in a plan view. The dummy stage exposes one of side surfaces of the main stage MS1 and faces the remaining side surfaces of the main stage MS1. That is, the dummy stage partially encloses the main stage MS1. According to embodiments, the shapes of the main stage MS1 and the dummy stage vary depending on a shape of the display module.

According to an embodiment, the dummy stage includes a first dummy portion DS1*a* and a second dummy portion DS1*b* that are spaced apart from each other with the main stage MS1 interposed therebetween in the first direction DR1, and a third dummy portion DS1*c*, which connects the first dummy portion DS1*a* to the second dummy portion DS1*b*.

According to an embodiment, a portion of the main stage MS1 is positioned between portions of the first and second dummy portions DS1*a* and DS1*b*. Since a portion of the main stage MS1 is positioned between portions of the first and second dummy portions DS1*a* and DS1*b*, the main stage MS1 has a side surface that is not hidden by the dummy stage and is exposed to the outside.

Similarly, according to an embodiment, the first to third dummy portions DS1*a*-DS1*c*, which are connected to each other, are movable in the third direction DR3 and thus can have a height that differs from the main stage MS1. In addition, the first to third dummy portions DS1*a*-DS1*c* can be rotated to be inclined at an angle relative to a horizontal plane, and the rotation of the first to third dummy portions DS1*a*-DS1*c* can be used to remove foreign substances deposited on the dummy stage by the cutting process. For example, the first to third dummy portions DS1*a*-DS1*c* can be rotated to have inclined top surfaces, and foreign substances deposited on the first to third dummy portions DS1*a*-DS1*c* can slide downward along the inclined top surfaces of the first to third dummy portions DS1*a*-DS1*c*.

Figure 8:
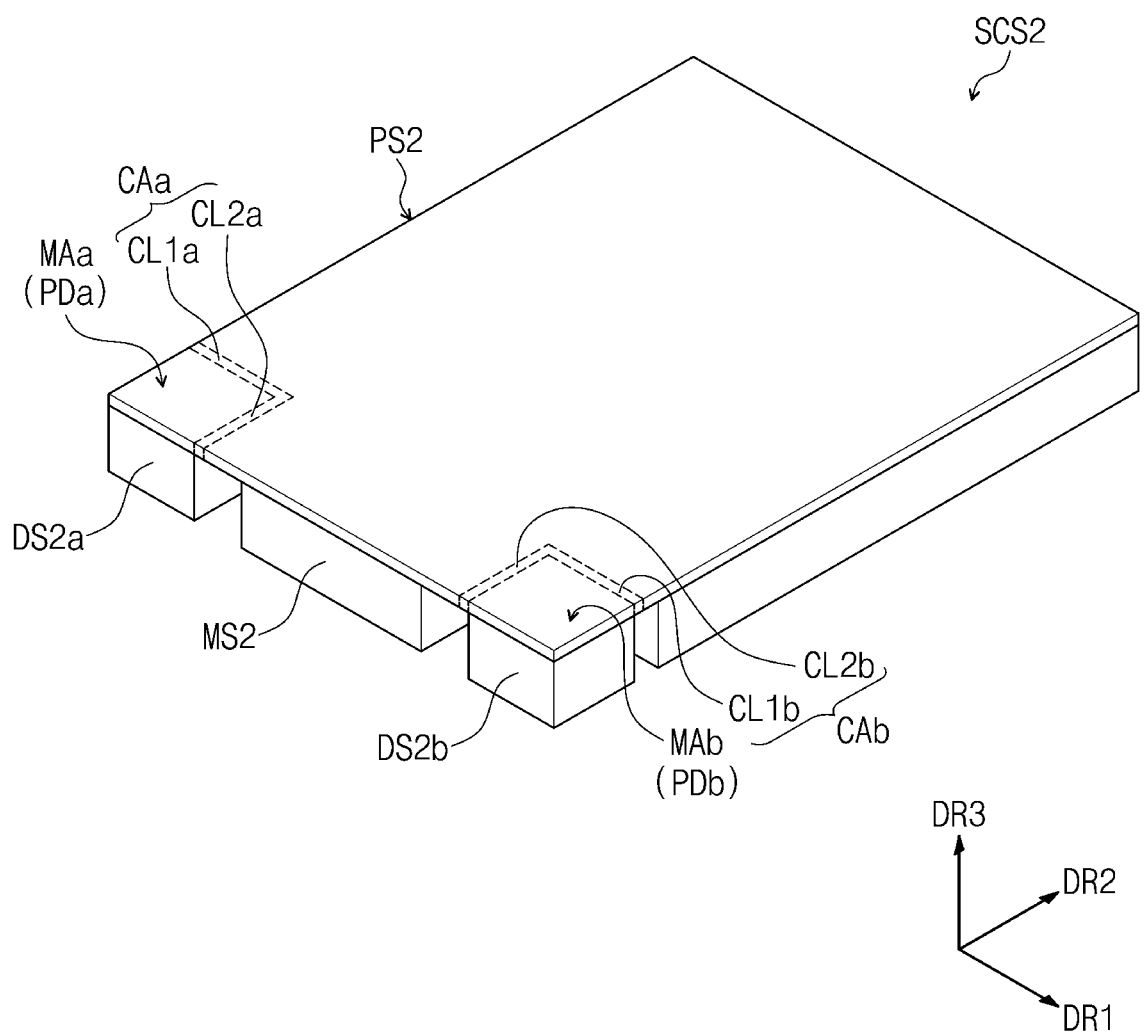
FIG. 8 is a perspective view of a substrate-cutting stage according to an embodiment of the inventive concept.
Figure 9:
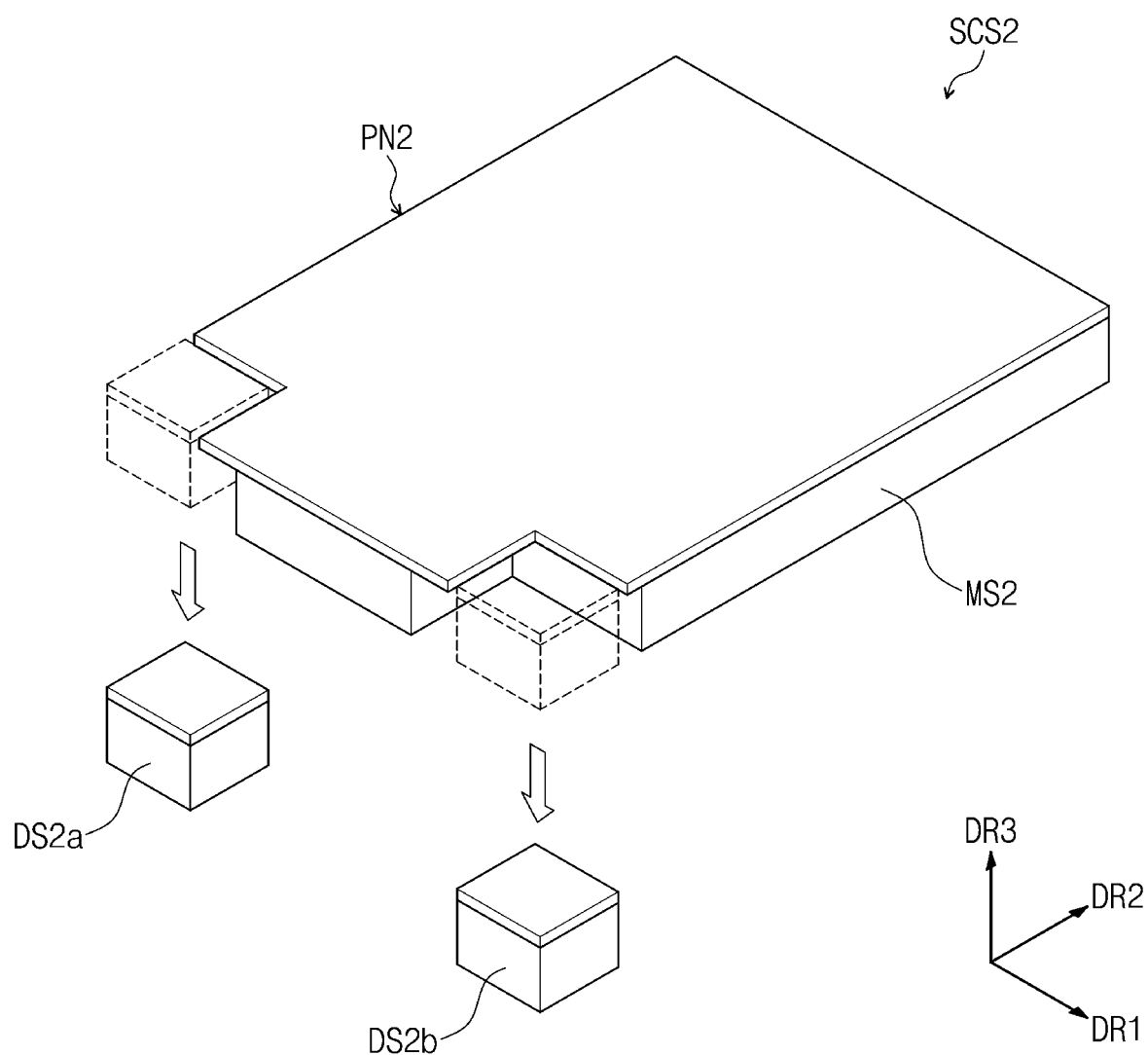
FIG. 9 is an exploded perspective view of a substrate-cutting stage shown in FIG. 8.
Figure 10:
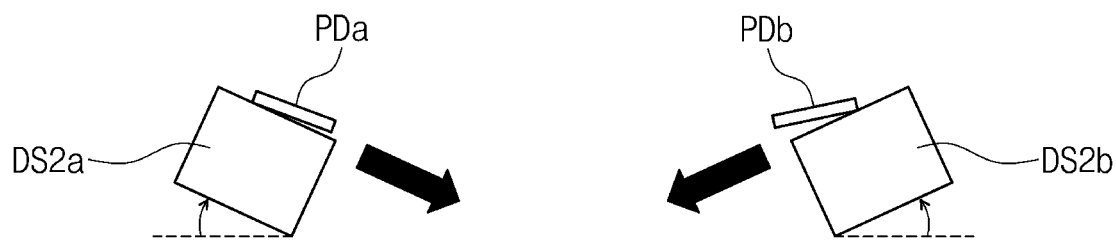
FIG. 10 is a perspective view of a dummy stage shown in FIG. 9.

FIG. 8 is a perspective view of a substrate-cutting stage according to an embodiment of the inventive concept. FIG. 9 is an exploded perspective view of a substrate-cutting stage shown in FIG. 8. FIG. 10 is a perspective view of a dummy stage shown in FIG. 9.

Referring to FIG. 8, according to an embodiment, a substrate-cutting stage SCS2 includes a main stage MS2, a first dummy portion DS2*a*, and a second dummy portion DS2*b*.

According to an embodiment, a substrate PS2 is disposed on the substrate-cutting stage SCS2. The substrate PS2 includes a first portion PN2 whose shape corresponds to the of a display module, a second portion PDa spaced apart from the first portion PN2 with a first cutting region CAa interposed therebetween, and a third portion PDb spaced apart from the first portion PN2 with a second cutting region CAb interposed therebetween. In an embodiment, the second portion PDa and the third portion PDb are spaced apart from each other in the first direction DR1 with the first portion PN2 interposed therebetween.

In addition, according to an embodiment, the substrate PS2 includes a first side surface and a second side surface that face each other in the first direction DR1, and a third side surface and a fourth side surface that face each other in the second direction DR2 and are connected to the first and second side surfaces.

In an embodiment, the first dummy portion DS2*a* overlaps a first corner region MAa of the substrate PS2 that is located adjacent to the first and third side surfaces. The first corner region MAa corresponds to the second portion PDa of the substrate PS2, which is divided from the first portion PN2 by the first cutting region CAa. The second dummy portion DS2*b* overlaps a second corner region MAb of the substrate PS2 that is located adjacent to the second and third side surfaces. The second corner region MAb corresponds to the third portion PDb of the substrate PS2, which is divided from the first portion PN2 by the second cutting region CAb.

According to an embodiment, the first and second dummy portions DS2*a* and DS2*b* are spaced apart from each other in the first direction DR1 with the main stage MS2 interposed therebetween. The main stage MS2 includes a first main portion between the first and second dummy portions DS2*a* and DS2*b*, and a second main portion that extends from the first main portion. The first portion PN2 of the substrate PS2 has a shape corresponding to the connected first and second main portions.

In an embodiment, the first cutting region CAa includes a first cutting line CL1*a* parallel to the first direction DR1, and a second cutting line CL2*a* connected to an end of the first cutting line CL1*a* and parallel to the second direction DR2. The first corner region MAa is separated from the first portion PN2 by the first cutting line CL1*a* and the second cutting line CL2*a*.

According to an embodiment, the second cutting region CAb includes a third cutting line CL1*b* parallel to the first direction DR1, and a fourth cutting line CL2*b* connected to an end of the third cutting line CL1*b* and parallel to the second direction DR2. The second corner region MAb is separated from the first portion PN2 by the third cutting line CL1*b* and the fourth cutting line CL2*b*.

According to an embodiment, the substrate-cutting stage SCS2 of FIG. 8 differs from the substrate-cutting stage SCS of FIG. 2 in the shapes of the main and dummy stages but can be operated in substantially the same manner as a substrate-cutting device previously described with reference to FIG. 3.

Referring to FIG. 9, according to an embodiment, the first dummy portion DS2*a* and the second dummy portion DS2*b* can be moved downward in the third direction DR3. The description that follows will refer to an example in which the first and second dummy portions DS2*a* and DS2*b* are moved downward in the third direction DR3, but in other embodiments, the first and second dummy portions DS2*a* and DS2*b* can be moved upward in the third direction DR3. Furthermore, the first dummy portion DS2a and the second dummy portion DS2b can be independently moved upward or downward in the same direction.

Referring to FIG. 10, according to an embodiment, an end portion of each of the first and second dummy portions DS2a and DS2b is moved upward in the third direction DR3 from a horizontal plane. For example, each of the first and second dummy portions DS2a and DS2b rotates to be inclined at an angle relative to a horizontal plane. As a result of rotating the first dummy portion DS2a, the second portion PDa disposed on the first dummy portion DS2a slides down the inclined surface of the first dummy portion DS2a. Similarly, as a result of rotating the second dummy portion DS2b, the third portion PDb disposed on the second dummy portion DS2b slides down the inclined surface of the second dummy portion DS2b.

Figure 11:
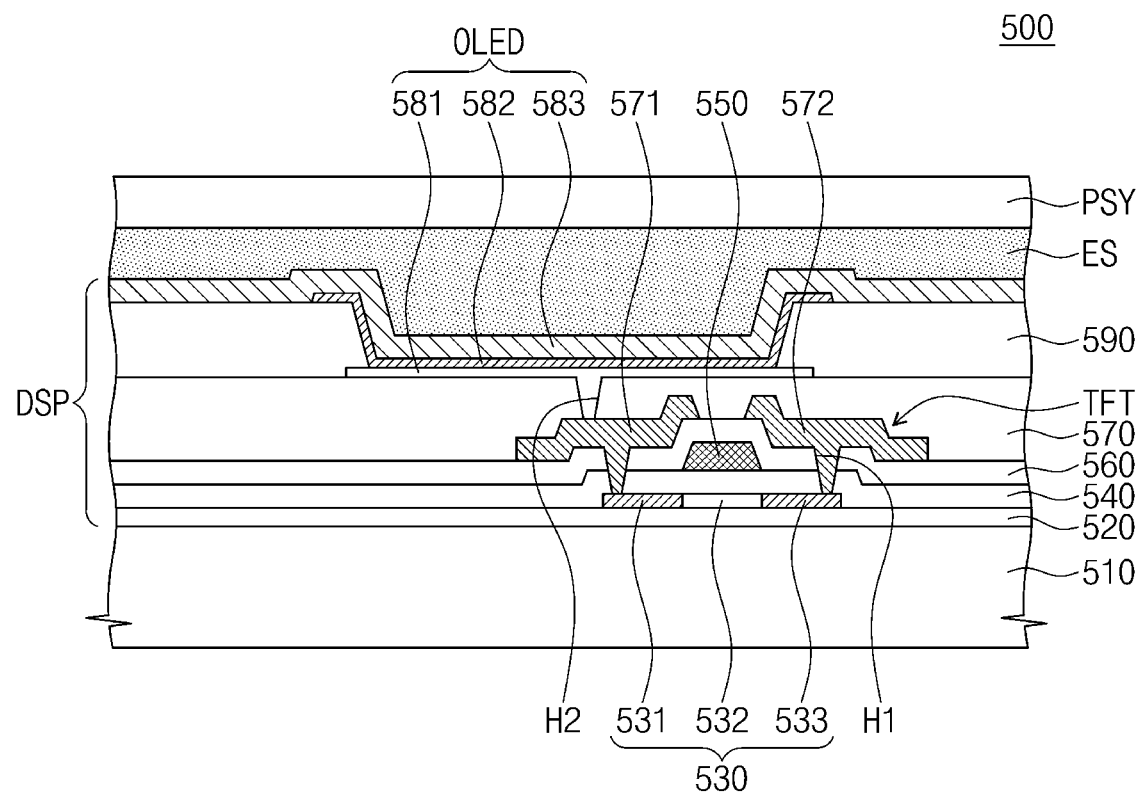
FIG. 11 is a sectional view of a portion of a display device fabricated using a substrate-cutting device according to an embodiment of the inventive concept.

FIG. 11 is a sectional view of a portion of a display device fabricated using a substrate-cutting device according to an embodiment of the inventive concept.

As shown in FIG. 11, according to an embodiment, a display device includes at least one thin-film transistor TFT and an organic light emitting device (OLED). The thin-film transistor may have a structure that differs from the structure shown in FIG. 11, and the number of thin-film transistors can vary.

Referring to FIG. 11, according to an embodiment, a display device 500 includes a substrate 510, a display part DSP, an encapsulation layer ES, and a protection layer PSY. The substrate 510 is formed of a flexible insulating material. For example, the substrate 510 is a polymer substrate formed of at least one of polyimide (PI), polycarbonate (PC), polyether sulfone (PES), polyethylene terephthalate (PET), polyethylenenaphthalate (PEN), polyacrylate (PAR), or fiberglass reinforced plastic (FRP).

In an embodiment, the substrate 510 is a glass substrate, and a thickness of the substrate 510 is determined so that the substrate 510 can bend. The substrate 510 is formed of or includes at least one metal. The substrate 510 may be transparent, semitransparent, or opaque. A buffer layer 520 is formed on a top surface of the substrate 510, and in an embodiment, the buffer layer 520 is formed of at least one organic or inorganic compound.

According to an embodiment, the buffer layer 520 blocks oxygen and moisture and helps realize a flat surface on the substrate 510. The buffer layer 520 is formed of or includes at least one inorganic material, such as silicon oxide (SiOx), silicon nitride (SiNx), silicon oxynitride (SiOxNy), aluminum oxide (AlOx), or aluminum nitride (AlOxNy)), or organic material such as, acrylic, polyimide, or polyester.

According to an embodiment, the thin-film transistor TFT is formed on the buffer layer 520. For the sake of simplicity, a description that follows will refer to an example in which the thin-film transistor is a top gate transistor, but the display device may include a thin-film transistor having a different structure, such as a bottom gate structure.

According to an embodiment, an active layer 530 that includes a plurality of arranged patterns is formed on the buffer layer 520, and a gate insulating layer 540 is formed that covers the active layer 530. The active layer 530 includes a source region 531, a drain region 533, and a channel region 532 therebetween.

According to an embodiment, the active layer 530 may contain various materials. For example, the active layer 530 is formed of or includes an inorganic semiconductor, such as silicon, has an amorphous or crystalline structure. As another example, the active layer 530 is formed of or includes an oxide semiconductor. For example, the oxide semiconductor includes a metal oxide material in which a metal is selected from the group 12, 13, or 14 metals, such as zinc (Zn), indium (In), gallium (Ga), tin (Sn), cadmium (Cd), germanium (Ge), or hafnium (Hf).

However, according to an embodiment, for convenience in description, the description that follows will refer to an example in which the active layer 530 is formed of amorphous silicon.

According to an embodiment, a gate electrode 550 is formed on a top surface of the gate insulating layer 540 and faces the active layer 530, and an interlayered insulating layer 560 is formed that covers the gate electrode 550.

According to an embodiment, a contact hole H1 is formed in the interlayered insulating layer 560 and the gate insulating layer 540, and then, a source electrode 571 and a drain electrode 572 are formed on the interlayered insulating layer 560 and in contact with the source region 531 and the drain region 533, respectively.

According to an embodiment, a passivation layer 570 is formed on the thin-film transistor TFT, and a pixel electrode 581 of the organic light emitting device (OLED) is formed on the passivation layer 570.

According to an embodiment, the pixel electrode 581 may be a transparent, semitransparent, or reflection electrode. If the pixel electrode 581 is a transparent or semitransparent electrode, the pixel electrode 581 is formed of or includes at least one of indium tin oxide (ITO), indium zinc oxide (IZO), zinc oxide (ZnO), indium oxide ($In_2O_3$), indium gallium oxide (IGO), or aluminum zinc oxide (AZO). If the pixel electrode 581 is a reflection electrode, the pixel electrode 581 includes a reflection layer formed of at least one of Ag, Mg, Al, Pt, Pd, Au, Ni, Nd, Ir, Cr, or alloys thereof, and a layer formed of ITO, IZO, ZnO, or $In_2O_3$. However, embodiments of the inventive concept a renot limited to the afore-described structure and materials of the pixel electrode 581.

According to an embodiment, the pixel electrode 581 is in contact with the drain electrode 572 of the thin-film transistor through a via hole H2 in the passivation layer 570. The passivation layer 570 is formed of at least one inorganic or organic material and may have a single- or double-layered structure. The passivation layer 570 is used as a planarization layer that has a flat top surface, regardless of any underlying unevenness. Alternatively, the passivation layer 570 has a top surface whose shape corresponds to a shape of an underlying layer. Furthermore, the passivation layer 570 is formed of a transparent insulating material that can realize a resonance effect.

According to an embodiment, after forming the pixel electrode 581 on the passivation layer 570, a pixel definition layer 590 is formed that covers the pixel electrode 581 and the passivation layer 570 and is then patterned to expose the pixel electrode 581. The pixel definition layer 590 is formed of at least one organic or inorganic material.

In addition, according to an embodiment, an intermediate layer 582 and an opposite electrode 583 are formed on at least the pixel electrode 581. The pixel electrode 581 and the opposite electrode 583 are used as an anode electrode and a cathode electrode, respectively, and in certain cases, the pixel electrode 581 and the opposite electrode 583 are used as a cathode electrode and an anode electrode, respectively. The pixel electrode 581 and the opposite electrode 583 are electrically disconnected from each other by the intermediate layer 582, and if different voltages are applied to the pixel electrode 581 and the opposite electrode 583, light is emitted from an organic emission layer in the intermediate layer 582.

According to an embodiment, the intermediate layer 582 includes an organic emission layer. In an embodiment, the intermediate layer 582 further includes at least one hole injection layer (HIL), hole transport layer (HTL), electron transport layer (ETL), and electron injection layer (EIL), in addition to the organic emission layer.

As described in previous embodiments, the organic emission layer includes a plurality of light-emitting patterns formed of a light-emitting material and locally formed in each pixel, but embodiments of the inventive concept are not limited thereto. For example, the organic emission layer can span all or at least two pixels. Here, the organic emission layer includes a plurality of vertically-stacked light-emitting layers, which emit red, green, and blue light, or a plurality of light-emitting materials mixed with each other. As long as the organic emission layer can emit white light, the combination of light-emitting layers or materials can vary.

In addition, according to an embodiment, a color-conversion layer or a color filter may be further provided to convert emitted white light to colored light.

According to an embodiment, after forming the display part DSP on the substrate 510, the encapsulation layer ES is formed on the display part DSP. The encapsulation layer ES includes a plurality of inorganic layers or may include an inorganic layer and an organic layer.

According to an embodiment, the protection layer PSY is formed on the encapsulation layer ES. The protection layer PSY may be formed by various methods. For example, the protection layer PSY may be formed by a sputtering method, an ion beam deposition method, an evaporation method, or a chemical vapor deposition method. The protection layer PSY may be formed of or include at least one of silicon nitride (SiNx), silicon oxynitride (SiOxNy), titanium oxide (TIOx), titanium nitride (TINx), titanium oxynitride (TiOxNy), zirconium oxide (ZrOx), tantalum nitride (TaNx), tantalum oxide (TaOx), hafnium oxide (HfOx), aluminum oxide (AlOx), or any other metal-containing oxide or nitride.

According to an embodiment, the protection layer PSY fully covers a side surface of the encapsulation layer ES. Thus, the protection layer PSY protects the encapsulation layer ES from moisture or oxygen, thereby increasing the life of the encapsulation layer ES.

According to an embodiment, the display device 500 may be a flexible display device and a rigid display device.

According to an embodiment of the inventive concept, a foreign substance can be effectively removed from a dummy stage after a substrate cutting process.

While exemplary embodiments of the inventive concept have been particularly shown and described, it will be understood by one of ordinary skill in the art that variations in form and detail may be made therein without departing from the spirit and scope of the attached claims.

What is claimed is:

1. A substrate-cutting stage, comprising:
a main stage and a dummy stage spaced apart from each other with a cutting region interposed therebetween and that support a substrate, wherein
the main stage supports a first portion of the substrate,
the dummy stage supports a second portion of the substrate, and
the cutting region overlaps a to-be-cut portion of the substrate disposed between the first and second portions,
wherein the dummy stage is movable in a thickness direction of the substrate.

2. The substrate-cutting stage of claim 1, wherein the dummy stage encloses the main stage.

3. The substrate-cutting stage of claim 2, wherein the to-be-cut portion encloses the first portion.

4. The substrate-cutting stage of claim 1, wherein the dummy stage is rotatable to be inclined at an angle relative to a plane of the main stage.

5. The substrate-cutting stage of claim 1, wherein the dummy stage exposes one side surface of the main stage and faces other side surfaces of the main stage.

6. The substrate-cutting stage of claim 5, wherein the dummy stage comprises
a first dummy portion and a second dummy portion that face each other in a first direction, and
a third dummy portion that connects an end of the first dummy portion to an end of the second dummy portion.

7. The substrate-cutting stage of claim 1, wherein the dummy stage comprises:
a first dummy portion that overlaps a first corner region of the substrate adjacent to a first side surface of the substrate that extends in a first direction and a third side surface of the substrate that extends in a second direction crossing the first direction; and
a second dummy portion that overlaps a second corner region of the substrate adjacent to the third side surface and a second side surface of the substrate that faces and is parallel to the first side surface.

8. The substrate-cutting stage of claim 7, wherein the cutting region comprises
a first cutting region provided between the first dummy portion and the main stage and
a second cutting region provided between the second dummy portion and the main stage.

9. The substrate cutting stage of claim 8, wherein
the first cutting region comprises a first cutting line parallel to the first direction and a second cutting line parallel to the second direction, and
the second cutting region comprises a third cutting line parallel to the first direction and a fourth cutting line parallel to the second direction.

* * * * *